(12) United States Patent
Tsuji et al.

(10) Patent No.: US 6,894,320 B2
(45) Date of Patent: May 17, 2005

(54) INPUT PROTECTION CIRCUIT

(75) Inventors: Nobuaki Tsuji, Hamamatsu (JP); Terumitsu Maeno, Iwata (JP)

(73) Assignee: Yamaha Corporation, Hamamatsu (JP)

( * ) Notice: Subject to any disclaimer, the term of this patent is extended or adjusted under 35 U.S.C. 154(b) by 116 days.

(21) Appl. No.: 10/244,246

(22) Filed: Sep. 16, 2002

(65) Prior Publication Data

US 2003/0052368 A1 Mar. 20, 2003

(30) Foreign Application Priority Data

Sep. 17, 2001 (JP) ........................................ 2001-282226

(51) Int. Cl.$^7$ ........................... H01L 29/72; H01L 23/62
(52) U.S. Cl. ..................................... 257/173; 257/355
(58) Field of Search ............................... 257/107, 124, 257/129, 133, 157, 173, 355, 356, 358, 360, 357; 438/133

(56) References Cited

U.S. PATENT DOCUMENTS

| 5,528,188 | A | * | 6/1996 | Au et al. ..................... 327/310 |
| 5,682,047 | A | * | 10/1997 | Consiglio et al. ............ 257/335 |
| 5,719,733 | A | * | 2/1998 | Wei et al. ..................... 361/56 |
| 5,932,916 | A | * | 8/1999 | Jung .......................... 257/355 |
| 6,433,979 | B1 | * | 8/2002 | Yu ............................... 361/56 |
| 6,458,632 | B1 | * | 10/2002 | Song et al. ................. 438/133 |
| 2002/0043687 | A1 | | 4/2002 | Tsuji |

FOREIGN PATENT DOCUMENTS

JP 2002-124580 4/2002

* cited by examiner

Primary Examiner—Craig A. Thompson
Assistant Examiner—Jennifer M. Dolan
(74) Attorney, Agent, or Firm—Pillsbury Winthrop Sha Pittman LLP

(57) ABSTRACT

An input protection circuit is provided which has a high electrostatic discharge (ESD) breakdown voltage and can input a signal in a wide positive and negative voltage range. In a surface layer of a substrate, a well and a field insulating film are formed. An emitter region is formed in the well to form a lateral bipolar transistor having the well as its base. Another emitter region is formed in the surface layer of the substrate to form another lateral bipolar transistor having the well as its collector. A gate electrode layer is formed on the field insulating film between the well and the other emitter region to form a MOS transistor. The emitter region is connected to an input terminal, the well is connected to the gate electrode layer, and the other emitter region and substrate are connected to a ground potential.

2 Claims, 3 Drawing Sheets

INPUT PROTECTION CIRCUIT

CROSS REFERENCE TO RELATED APPLICATION

This application is based on Japanese Patent Application No. 2001-282226, filed on Sep. 17, 2001, the entire contents of which are incorporated herein by reference.

BACKGROUND OF THE INVENTION

A) Field of the Invention

The present invention relates to an input protection circuit for protecting an input circuit of an integrated circuit device such as MOS-LSI from being broken by electrostatic discharge (ESD) or the like. In this specification, the term "ESD input" is intended to mean "a surge voltage input by electrostatic discharge or the like".

B) Description of the Related Art

Input protection circuits used for CMOSIC and the like such as shown in FIGS. 4 and 5 are known. In FIGS. 4 and 5, IN represents an input terminal from which an input signal is supplied to a main circuit MC.

In the circuit shown in FIG. 4, an n-channel MOS transistor $FT_1$ has its drain connected to the input terminal IN and its gate G, source S and substrate are connected to the ground potential (reference potential) $V_{SS}$. A diode $D_1$ represents the drain pn junction of the transistor $FT_1$.

When a positive ESD input out of a predetermined voltage range is applied to the input terminal IN, the transistor $FT_1$ becomes conductive by punch through so that the main circuit MC is protected from the ESD input. When a negative ESD input out of a predetermined voltage range is applied to the input terminal IN, the diode $D_1$ becomes conductive so that the main circuit MC is protected from the ESD input.

In the circuit shown in FIG. 5, in addition to the constituent elements of the circuit shown in FIG. 4, a p-channel MOS transistor $FT_2$ is added whose drain D is connected to the input terminal IN and whose gate G, source S and substrate are connected to a power source line at a power source potential $V_{DD}$ (e.g., +5 V). A diode $D_2$ represents the drain pn junction of the transistor $FT_2$.

The protection operation of the transistor $FT_1$ is similar to that of the circuit shown in FIG. 4. When a negative ESD input out of a predetermined voltage range is applied to the input terminal IN, the transistor $FT_2$ becomes conductive by punch through so that the main circuit MC is protected from the ESD input. When a positive ESD input out of a predetermined voltage range is applied to the input terminal IN, the diode $D_2$ becomes conductive so that the main circuit MC is protected from the ESD input.

The circuits shown in FIGS. 4 and 5 limit the signal level which can be input under a normal use condition. Namely, the breakdown voltage of the gate insulating film of the transistors $FT_1$ and $FT_2$ is generally about 10 V. If a signal voltage of +12 V is applied to the input terminal IN, the gate insulating film of the transistor $FT_1$ is broken. If a signal voltage of −12 V is applied to the input terminal IN, the gate insulating film of the transistor $FT_2$ is broken. If a signal voltage of +12 V is applied to the input terminal IN, the diode $D_2$ becomes conductive, whereas if a signal voltage of −12 V is applied to the input terminal IN, the diode $D_1$ becomes conductive. Therefore, with the circuits shown in FIGS. 4 and 5, a signal of ±12 V cannot be input to the main circuit MC. Furthermore, an ESD breakdown voltage is low because the gate insulating film of the transistors $FT_1$ and $FT_2$ has a low breakdown voltage.

SUMMARY OF THE INVENTION

An object of this invention is to provide a novel input protection circuit with a high ESD breakdown voltage which can input a signal in a wide positive and negative voltage range.

According to one aspect of the present invention, there is provided a first input protection circuit comprising: a semiconductor substrate of a first conductivity type; a main circuit formed on the semiconductor substrate; an input terminal formed on the semiconductor substrate and connected to the main circuit; a well of a second conductivity type opposite to the first conductivity type formed in a principal surface of the semiconductor substrate, the well forming a pn junction together with the semiconductor substrate; a first lateral bipolar transistor having the well as a base, the semiconductor substrate as a collector, and a first emitter region of the first conductivity type formed in the well; a second lateral bipolar transistor having the well as a collector, the semiconductor substrate as a base, and a second emitter region of the second conductivity type formed in the principal surface of the semiconductor substrate near the well; and an insulated gate electrode of a MOS transistor having the well and the second emitter region as a drain and a source, the insulated gate electrode being forming on a surface of the semiconductor substrate between the well and the second emitter region, wherein the input terminal is connected to the first emitter region, the well is connected to the insulated gate electrode, the second emitter region and the semiconductor substrate are connected to a reference potential, and a thyristor constituted of the first and second lateral bipolar transistors is made conductive by using as a trigger a current flowing through the MOS transistor when a surge voltage is applied from the input terminal to the insulated gate electrode via an emitter pn junction of the first lateral bipolar transistor.

According to another aspect of the invention, there is provided a second input protection circuit comprising: a semiconductor substrate of a first conductivity type; a main circuit formed on the semiconductor substrate; an input terminal formed on the semiconductor substrate and connected to the main circuit; a first well of a second conductivity type opposite to the first conductivity type formed in a principal surface of the semiconductor substrate, the first well forming a pn junction together with the semiconductor substrate; a second well of the first conductivity type formed in the principal surface of the semiconductor substrate in contact with the first well, the second well forming a pn junction together with the first well; a first lateral bipolar transistor having the first well as a base, the second well as a collector, and a first emitter region of the first conductivity type formed in the first well; a second lateral bipolar transistor having the first well as a collector, the second well as a base, and a second emitter region of the second conductivity type formed in the principal surface of the semiconductor substrate in the second well near the first well; and an insulated gate electrode of a MOS transistor having the first well and the second emitter region as a drain and a source, the insulated gate electrode being forming on a surface of the semiconductor substrate between the first well and the second emitter region, wherein the input terminal is connected to the first emitter region, the first well is connected to the insulated gate electrode, the second emitter region and the second well are connected to a reference potential, and a thyristor constituted of the first and second lateral bipolar transistors is made conductive by using as a trigger a current flowing through the MOS transistor when a surge voltage is applied from the input terminal to the insulated gate electrode via an emitter pn junction of the first lateral bipolar transistor.

According to the first and second input protection circuits, if the first conductivity type of a p-type and the second conductivity type is an n-type, the first and second lateral bipolar transistors are a pnp transistor and an npn transistor, respectively. A combination of the two transistors constitutes a thyristor. The MOS transistor has the collector and emitter of the second npn bipolar transistor as its drain and source and an n-channel. The gate insulating film of the MOS transistor can be made of a field insulating film (oxide film) so that a breakdown voltage of about 250 V can be obtained.

The absolute value of the threshold voltage of the MOS transistor can be set larger than Vm−Vf, where Vm is a maximum value of a normal input voltage supplied to the input terminal and Vf is a forward voltage drop of the emitter pn junction of the first bipolar transistor. As a positive ESD input is applied to the input terminal, the MOS transistor becomes conductive when the gate voltage reaches the threshold voltage, and current flows through the second npn bipolar transistor formed in the same region as that of the MOS transistor. Electrons flowing from the $n^+$-type emitter region to the n-type collector region via the p-type base region bias the n-type region negative. By using charges generated by this current as a trigger, the thyristor becomes conductive to flow a large current. In this manner, the main circuit is protected from the positive ESD input.

As a negative ESD input is applied to the input terminal, the first pnp bipolar transistor becomes conductive and flows a large current when the absolute value of the negative ESD input becomes $V_B+Vf_1$, where $V_B$ is a breakdown voltage of one of the emitter pn junctions of the first pnp bipolar transistor backward biased and and $Vf_1$ is a forward voltage drop of the other pn junction forward biased. In this manner, the main circuit is protected from the negative ESD input.

Under the normal use condition, as a voltage of +Vm is applied to the input terminal, since the gate voltage of the MOS transistor is Vm−Vf, the MOS transistor is not conductive. In the first bipolar transistor, the pn junction between the n-type well and p-type substrate of the first input protection circuits is backward biased, and the pn junction between the n-type first well and p-type second well is backward biased. Since these pn junctions are formed between regions having a low impurity concentration, they can have a high breakdown voltage of about 50 V. For example, if Vm is 12 V, current does not substantially flow through the first bipolar transistor and the signal voltage of +Vm can be normally input to the main circuit.

As a voltage of −Vm is applied to the input terminal, in the first bipolar transistor, the pn junction between the p-type emitter region and n-type well is backward biased and the pn junction between the n-type well and p-type substrate or p-type well is forward biased. It is easy to set the breakdown voltage of the backward biased pn junction to about 12 V, and the forward voltage drop of the forward biased pn junction is generally about 0.6 V. For example, if Vm is 12 V, current does not substantially flow through the first bipolar transistor and the signal voltage of −Vm can be normally input to the main circuit.

The second input protection circuit corresponds to the first input protection circuit in which the well of the first conductivity type is formed in contact with the well of the second conductivity type, both the wells forming a pn junction. The second input protection circuit has the advantage that the degree of freedom of setting the characteristics of the second bipolar transistor and MOS transistor becomes high.

As above, the thyristor is constituted of the first lateral bipolar transistor having the well and semiconductor substrate (or other well) as its base and collector and the second lateral bipolar transistor having the base and collector of the first lateral bipolar transistor as its collector and base. The MOS transistor has the insulated gate electrode formed on the base of the second lateral bipolar transistor, and the collector and emitter of the second lateral bipolar transistor as its drain and source. The thyristor is made conductive by using, as a trigger, charges generated by the current flowing through the MOS transistor when an ESD input is applied from the input terminal to the insulated gate electrode via the emitter pn junction of the first lateral bipolar transistor.

Since the gate insulating film of the MOS transistor and the pn junction between the well and substrate (or other well) have a high breakdown voltage, a high ESD breakdown voltage can be obtained and an input signal in a wide positive and negative voltage range, e.g., −12 V to +12 V, can be normally input to the main circuit.

DESCRIPTION OF THE PREFERRED EMBODIMENTS

Figure 1:
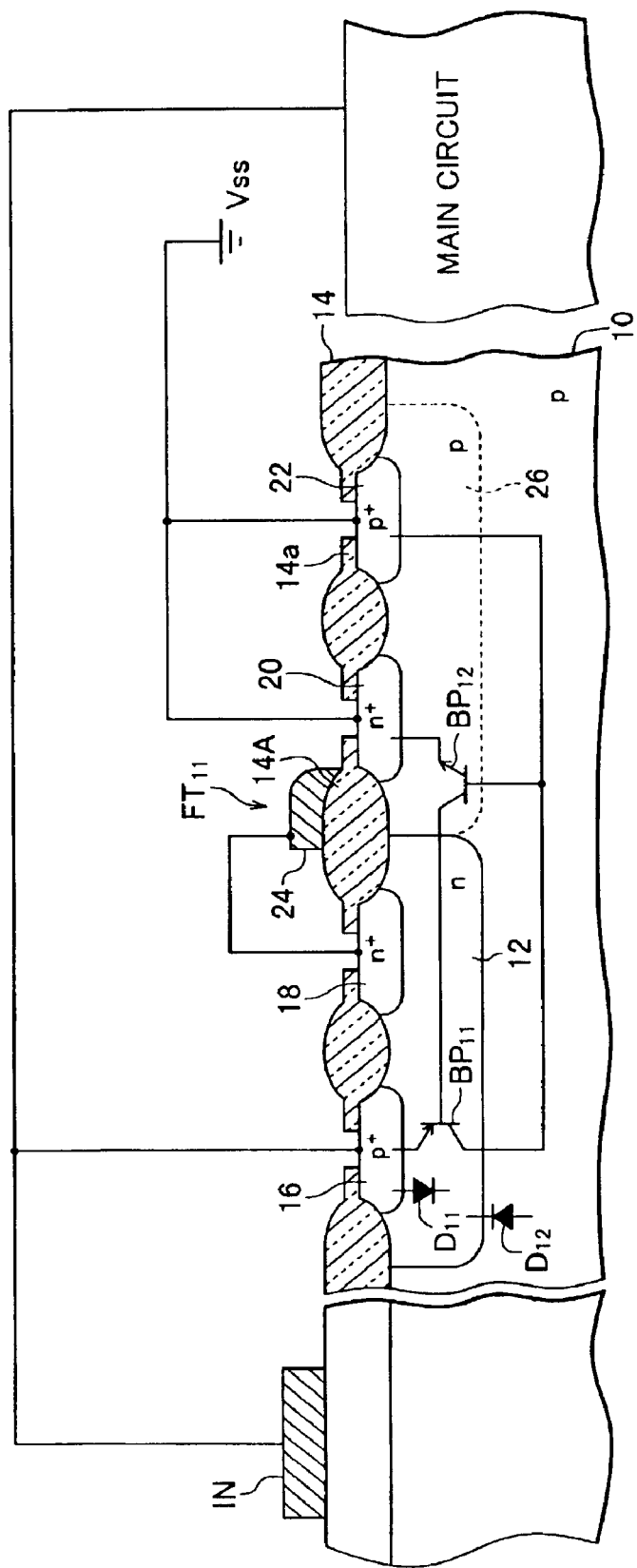
FIG. 1 is a cross sectional view showing the integrated structure of an input protection circuit according to an embodiment of the invention.
Figure 2:
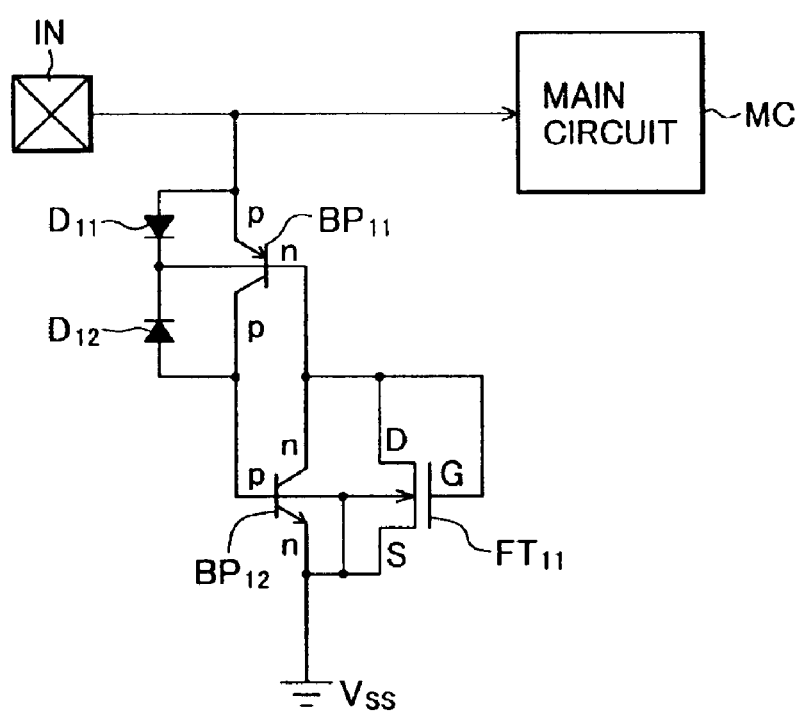
FIG. 2 is an equivalent circuit diagram of the input protection circuit shown in FIG. 1.

FIG. 1 shows the integrated structure of an input protection circuit according to an embodiment of the invention. FIG. 2 is an equivalent circuit diagram of the input protection circuit shown in FIG. 1. In FIGS. 1 and 2, IN represents an input terminal from which an input signal is supplied to a main circuit MC.

A semiconductor substrate 10 made of, e.g., p-type silicon, has a relatively low impurity concentration (e.g., $10^{15}$ cm$^{-3}$ or lower). In the principal surface of the semiconductor substrate 10, an n-type well 12 is formed constituting a pn junction together with the substrate 10. The well 12 has a relatively low impurity concentration (e.g., $4 \times 10^{16}$ to $1 \times 10^{17}$ cm$^{-3}$) and is formed by selective ion implantation or the like.

In the principal surface of the substrate 10, a field insulating film 14 of silicon oxide or the like is formed. This insulating film 14 is formed by local oxidation of silicon (Locos) and has a plurality of openings. In each opening, a thin insulating film 14a of silicon oxide or the like is formed. $p^+$-type impurity doped regions 16 and 22 are formed by doping p-type impurities into corresponding openings. $n^+$-type impurity doped regions 18 and 20 are formed by doping n-type impurities into corresponding openings.

The $p^+$-type region 16 is formed in the n-type well 12 of the p-type substrate 10 to constitute a pnp lateral bipolar transistor $BP_{11}$. In this transistor $BP_{11}$, the $p^+$-type region 16 serves as the emitter, the well 12 serves as the base, and the substrate 10 serves as the collector. The emitter region 16 is connected to the input terminal IN. The contact region 18 is used for providing a low resistance contact of the base region 12. Diodes $D_{11}$ and $D_{12}$ represent an emitter pn junction and a collector pn junction of the transistor $BP_{11}$.

In the principal surface of the substrate 10, the n$^+$-type region 20 is formed near the n-type well 12 with a portion of the p-type substrate being interposed, the n$^+$-type region 20 constituting an npn lateral bipolar transistor $BP_{12}$. This transistor $BP_{12}$ has the n-type well 12 as its collector, the p-type substrate 10 as its base and the n$^+$-type region 20 as its emitter. The contact region 22 is used for providing a low resistance contact of the base region 10. The emitter region 20 and contact region 22 are connected to a ground potential (reference potential) $V_{SS}$. A combination of the transistors $BP_{11}$ and $BP_{12}$ constitutes a thyristor.

On the semiconductor surface (on the p-type base) between the well 12 and emitter region 20, a gate electrode layer 24 of a MOS transistor $FT_{11}$ is formed with a portion 14A of the insulating film 14 being interposed. The portion 14A of the insulating film 14 serves as the gate insulating film. For example, the gate electrode layer 24 is made of a polycide layer (a lamination of a silicide layer formed on a polysilicon layer). The transistor $FT_{11}$ has the well 12 as its drain, the n$^+$-type region 20 as its source, and an n-type channel.

The gate electrode layer 24 (gate G of the transistor $FT_{11}$) is connected via the contact region 18 to the well 12 (base of the transistor $BP_{11}$, collector of the transistor $BP_{12}$ and drain D of the transistor $FT_{11}$). The transistor $FT_{11}$ has the absolute value of the threshold voltage larger than Vm−Vf, where Vm is a maximum value of a normal input voltage supplied to the input terminal IN and Vf is a forward voltage drop of the emitter pn junction (diode $D_{11}$) of the transistor $BP_{11}$. The gate insulating film 14A of the transistor $FT_{11}$ has a breakdown voltage of about 250 V because it is made of the field insulating film (oxide film).

The emitter region 20 (source S of the transistor $FT_{11}$) of the transistor $BP_{12}$ is connected to the ground potential (reference potential) $V_{SS}$. The substrate 10 (collector of the transistor $BP_{11}$, base of the transistor $BP_{12}$ and substrate of the transistor $FT_{11}$) is connected via the contact region 22 to the ground potential $V_{SS}$.

Next, the operation of the input protection circuit shown in FIGS. 1 and 2 will be described. As a positive ESD input is applied to the input terminal IN, the transistor $FT_{11}$ becomes conductive when the gate voltage reaches the threshold voltage, and current flows through the transistor $BP_{12}$ formed in the same region as that of the transistor $FT_{11}$. Electrons flowing from the n$^+$-type emitter region 20 to the n-type collector region via the p-type base region 10 bias the n-type region 12 negative. By using charges generated by the current flowing through the transistor $BP_{12}$ as a trigger, the thyristor constituted of the transistors $BP_{11}$ and $BP_{12}$ is subjected to a snap-back and becomes conductive to flow a large current. For example, assuming that Vm=12 V, Vf=0.6 V and the threshold voltage Vth of the transistor $FT_{11}$ is 11.4 V, current flows through the transistor $FT_{11}$ at the gate voltage in excess of 11.4 V and this current makes the thyristor conductive. In this manner, the main circuit MC is protected from the positive ESD input.

As a negative ESD input of $-V_{esd}$ is applied to the input terminal IN, the transistor $BP_{11}$ becomes conductive and flows a large current when the absolute value of $-V_{esd}$ becomes $V_B + Vf_1$, where $V_B$ is a breakdown voltage of the emitter pn junction (diode $D_{11}$) and $Vf_1$ is a forward voltage drop of the collector pn junction (diode $D_{12}$). For example, assuming that $V_B$=12 V and $Vf_1$=0.6 V, the transistor $BP_{11}$ becomes conductive when the absolute value of $-V_{esd}$ becomes 12.6 V. In this manner, the main circuit MC is protected from the negative ESD input.

Under the normal use condition, as a voltage of +Vm is applied to the input terminal IN, since the gate voltage of the transistor $FT_{11}$ is Vm−Vf, the transistor $FT_{11}$ is not conductive. In the transistor $BP_{11}$, the emitter pn junction (diode $D_{11}$) is forward biased and the collector pn junction (diode $D_{12}$) is backward biased. The breakdown voltage of the collector pn junction ($D_{12}$) can be set to about 50 V since the impurity concentration of the well 12 and substrate 10 is low. In this setting, the transistor $BP_{11}$ is not conductive at Vm=12 V. In this manner, a voltage of +Vm is normally input to the main circuit MC.

As a voltage of −Vm is applied to the input terminal IN, the emitter pn junction (diode $D_{11}$) of the transistor $BP_{11}$ is backward biased and the collector pn junction (diode $D_{12}$) is forward biased. For example, assuming that Vm=12 V, the breakdown voltage of the emitter pn junction ($D_{11}$) is 12 V, and the forward voltage drop of the collector pn junction ($D_{12}$) is 0.6 V, the transistor $BP_{11}$ is not conductive at the input voltage of −12 V. In this manner, a voltage of −Vm is normally input to the main circuit MC.

In this embodiment, a p-type well 26 may be formed in the principal surface of the substrate in contact with the n-type well 12, the p-type well forming a pn junction together with the n-type well. The p-type well 26 has a relatively low impurity concentration (e.g., $4 \times 10^{16}$ to $1 \times 10^{17}$ cm$^{-3}$) and is formed by selective ion implantation. In the well 26, the n$^+$-type emitter/source region 20 and p$^+$-type contact region 22 of the transistor $BP_{12}$ are formed in the manner similar to that described earlier.

The transistor $BP_{11}$ has the well 12 as its base and the well 26 as its collector. The transistor $BP_{12}$ has the well 12 as its collector and the well 26 as its base. The well 26 (collector of the transistor $BP_{11}$, base of the transistor $BP_{12}$, and substrate of the transistor $FT_{11}$) is connected via the contact region 22 to the ground potential $V_{SS}$.

The circuit with the well 26 has the same equivalent circuit as that shown in FIG. 2 and the same operation as that described above. By providing the well 26, the degree of freedom of setting the characteristics of the transistors $BP_{12}$ and $FT_{11}$ can be improved.

Figure 3:
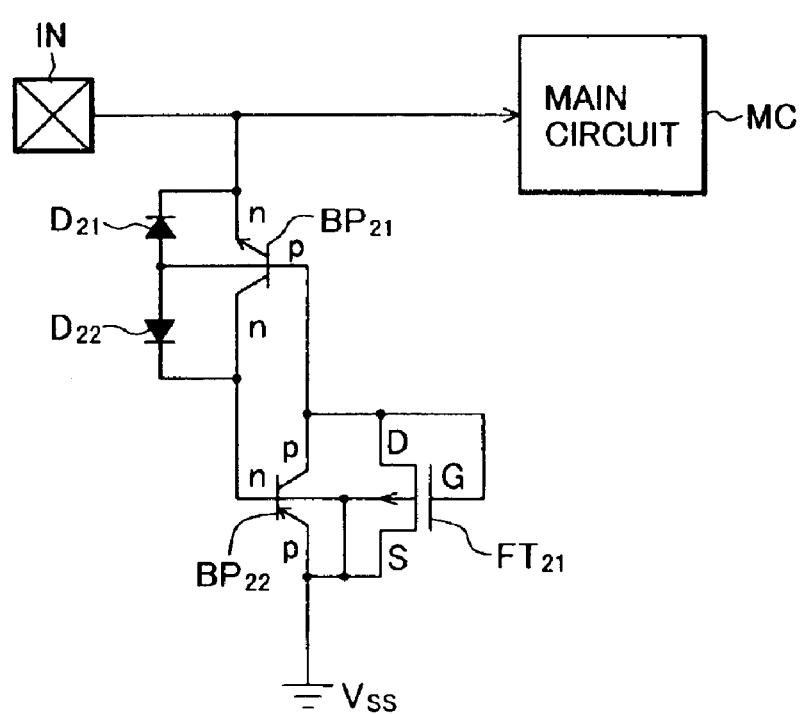
FIG. 3 is a circuit diagram of a modification of the circuit shown in FIG. 2.
Figure 4:
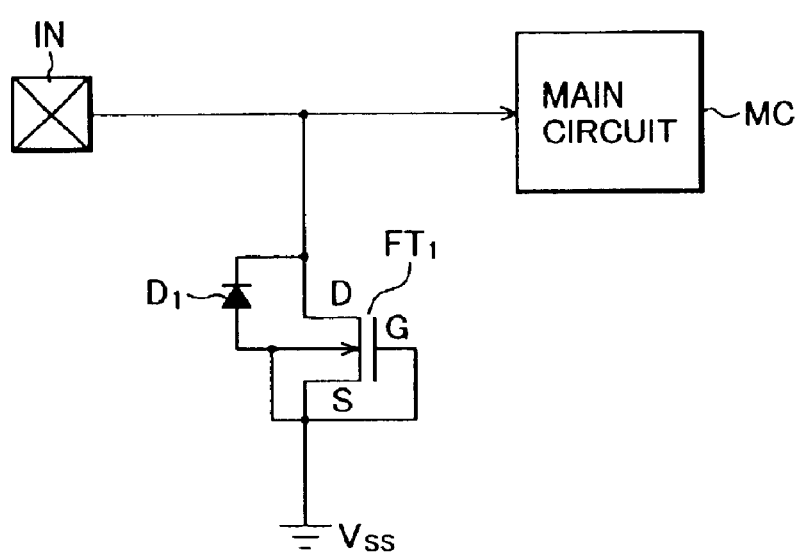
FIG. 4 is a circuit diagram showing an example of a conventional input protection circuit.
Figure 5:
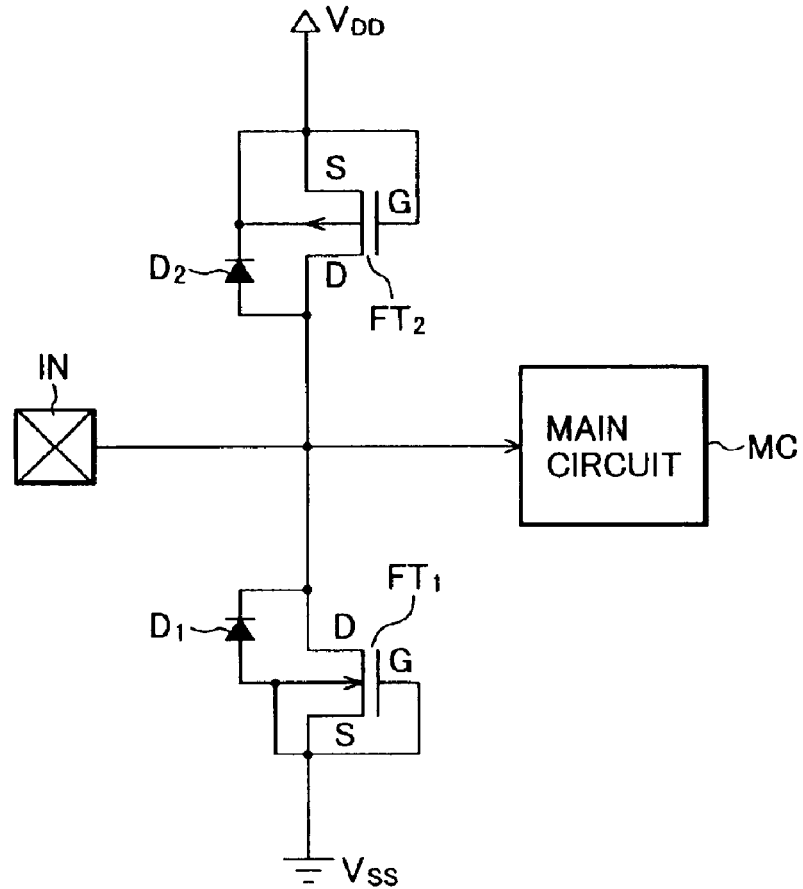
FIG. 5 is a circuit diagram showing another example of the conventional input protection circuit.

FIG. 3 shows a modification of the circuit shown in FIG. 2, the modification having the n- and p-conductivity types opposite to those shown in FIG. 2. In FIG. 3, like elements to those shown in FIG. 2 are represented by using identical reference symbols and the detailed description thereof is omitted.

The emitter of an npn bipolar transistor $BP_{21}$ is connected to the input terminal IN, and the collector and base thereof are connected to the base and collector of a pnp bipolar transistor $BP_{22}$. A combination of the transistors $BP_{21}$ and $BP_{22}$ constitutes a thyristor. Diodes $D_{21}$ and $D_{22}$ represent the emitter and collector pn junctions of the transistor $BP_{21}$.

A p-channel MOS transistor $FT_{21}$ has the collector and emitter of the transistor $BP_{22}$ as its drain D and source S. The gate G of the transistor $FT_{21}$ is connected to the base of the transistor $BP_{21}$, the collector of the transistor $BP_{22}$, and the drain D of the transistor $FT_{21}$. The emitter of the transistor $BP_{22}$, the source of the transistor $FT_{21}$ and the substrate are connected to the ground potential $V_{SS}$.

The integrated structure of the circuit shown in FIG. 3 is obtained by inverting the conductivity type of each region of the integrated structure shown in FIG. 1. In this case, the absolute value of the threshold voltage of the transistor $FT_{21}$ corresponding to the transistor $FT_{11}$ is set larger than Vm−Vf, where Vm is a maximum value of a normal input voltage supplied to the input terminal IN and Vf is a forward voltage drop of the emitter pn junction (diode $D_{21}$) of the transistor $BP_{21}$. An n-type well corresponding to the well 26 may be omitted.

In the circuit shown in FIG. 3, as a negative ESD input is applied to the input terminal IN, the transistor $FT_{21}$ becomes conductive when the gate voltage reaches the threshold voltage, and current flows through the transistor $BP_{22}$. Holes flowing from the $p^+$-type emitter region to the p-type collector region via the n-type base region bias the p-type region positive. By using charges generated by current flowing through the transistor as a trigger, the thyristor constituted of the transistors $BP_{21}$ and $BP_{22}$ is subjected to a snap-back and becomes conductive to flow a large current. For example, assuming that Vm=12 V, Vf=0.6 V and Vth=−11.4 V, current flows through the transistor $FT_{21}$ at the gate voltage in excess of −11.4 V and this current makes the thyristor conductive. In this manner, the main circuit MC is protected from the negative ESD input.

As a positive ESD input is applied to the input terminal IN, the transistor $BP_{21}$ becomes conductive and flows a large current at $V_B+Vf_1$, where $V_B$ is a breakdown voltage of the emitter pn junction (diode $D_{21}$) and $Vf_1$ is a forward voltage drop of the collector pn junction (diode $D_{22}$). For example, assuming that $V_B$=12 V and $Vf_1$=0.6 V, the transistor $BP_{21}$ becomes conductive at 12.6 V. In this manner, the main circuit MC is protected from the positive ESD input.

Under the normal use condition, as a voltage of −Vm is applied to the input terminal IN, since the gate voltage of the transistor $FT_{21}$ is −(Vm−Vf), the transistor $FT_{21}$ is not conductive. In the transistor $BP_{21}$, the emitter pn junction (diode $D_{21}$) is forward biased and the collector pn junction (diode $D_{22}$) is backward biased. The breakdown voltage of the collector pn junction ($D_{22}$) is set to about 50 V as described with reference to the well 12 and substrate 10. In this setting, the transistor $BP_{21}$ is not conductive at Vm=12 V. In this manner, a voltage of −Vm is normally input to the main circuit MC.

As a voltage of +Vm is applied to the input terminal IN, the emitter pn junction (diode $D_{21}$) of the transistor $BP_{21}$ is backward biased and the collector pn junction (diode $D_{22}$) is forward biased. For example, assuming that Vm=12 V, the breakdown voltage of the emitter pn junction ($D_{21}$) is 12 V, and the forward voltage drop of the collector pn junction ($D_{22}$) is 0.6 V, the transistor $BP_{21}$ is not conductive at the input voltage of +12 V. In this manner, a voltage of +Vm is normally input to the main circuit MC.

The present invention has been described in connection with the preferred embodiments. The invention is not limited only to the above embodiments. It is apparent that various modifications, improvements, combinations, and the like can be made by those skilled in the art.

What we claim are:

1. An input protection circuit comprising:
   a semiconductor substrate of a first conductivity type;
   a main circuit formed on said semiconductor substrate;
   an input terminal formed above said semiconductor substrate and connected to said main circuit;
   a well of a second conductivity type opposite to the first conductivity type formed in a principal surface of said semiconductor substrate, said well forming a pn junction together with said semiconductor substrate;
   a first lateral bipolar transistor having said well as a base, said semiconductor substrate as a collector, and a first emitter region of the first conductivity type formed in said well;
   a second lateral bipolar transistor having said well as a collector, which is thereby connected to the base of the first lateral bipolar transistor, said semiconductor substrate as a base, which is thereby connected to the collector of the first lateral bipolar transistor, and a second emitter region of the second conductivity type formed in the principal surface of said semiconductor substrate near said well; and
   an insulated gate electrode of a MOS transistor having said well and the second emitter region as a drain and a source respectively, said insulated gate electrode being formed on a surface of said semiconductor substrate between said well and the second emitter region,
   wherein said input terminal is connected to the first emitter region, said well is connected to said insulated gate electrode and is electrically floating, the second emitter region and said semiconductor substrate are connected to a reference potential, and a thyristor constituted of said first and second lateral bipolar transistors is made conductive by using as a trigger a current flowing through the MOS transistor when a surge voltage is applied from said input terminal to said insulated gate electrode only via an emitter pn junction of said first lateral bipolar transistor.

2. An input protection circuit comprising:
   a semiconductor substrate of a first conductivity type;
   a main circuit formed on said semiconductor substrate;
   an input terminal formed above said semiconductor substrate and connected to said main circuit;
   a first well of a second conductivity type opposite to the first conductivity type formed in a principal surface of said semiconductor substrate, said first well forming a pn junction together with said semiconductor substrate;
   a second well of the first conductivity type formed in the principal surface of said semiconductor substrate in contact with said first well, said second well forming a pn junction together with said first well;
   a first lateral bipolar transistor having said first well as a base, said second well as a collector, and a first emitter region of the first conductivity type formed in said first well;
   a second lateral bipolar transistor having said first well as a collector, which is thereby connected to the base of the first lateral bipolar transistor, said second well as a base, which is thereby connected to the collector of the first lateral bipolar transistor, and a second emitter region of the second conductivity type formed in the principal surface of said semiconductor substrate in said second well near said first well; and
   an insulated gate electrode of a MOS transistor having said first well and the second emitter region as a drain and a source respectively, said insulated gate electrode being formed on a surface of said semiconductor substrate between said first well and the second emitter region,
   wherein said input terminal is connected to the first emitter region, said first well is connected to said insulated gate electrode and is electrically floating, the second emitter region and said second well are connected to a reference potential, and a thyristor constituted of said first and second lateral bipolar transistors is made conductive by using as a trigger a current flowing through the MOS transistor when a surge voltage is applied from said input terminal to said insulated gate electrode only via an emitter pn junction of said first lateral bipolar transistor.

* * * * *